United States Patent
Siemieniec et al.

(10) Patent No.: US 12,408,410 B2
(45) Date of Patent: Sep. 2, 2025

(54) SILICON CARBIDE DEVICE WITH STRIPE-SHAPED GATE ELECTRODE AND SOURCE METALLIZATION

(71) Applicant: Infineon Technologies AG, Neubiberg (DE)

(72) Inventors: Ralf Siemieniec, Villach (AT); Dethard Peters, Hoechstadt (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 391 days.

(21) Appl. No.: 17/473,917

(22) Filed: Sep. 13, 2021

(65) Prior Publication Data

US 2022/0093761 A1   Mar. 24, 2022

(30) Foreign Application Priority Data

Sep. 21, 2020 (EP) ..................... 20197223

(51) Int. Cl.
| | |
|---|---|
| H10D 64/27 | (2025.01) |
| H01L 23/482 | (2006.01) |
| H10D 30/66 | (2025.01) |
| H10D 62/10 | (2025.01) |
| H10D 62/832 | (2025.01) |
| H10D 64/00 | (2025.01) |
| H10D 64/23 | (2025.01) |

(52) U.S. Cl.
CPC ....... *H10D 64/519* (2025.01); *H01L 23/4824* (2013.01); *H10D 30/665* (2025.01); *H10D 30/668* (2025.01); *H10D 62/107* (2025.01); *H10D 62/8325* (2025.01); *H10D 64/111* (2025.01); *H10D 64/252* (2025.01)

(58) Field of Classification Search
CPC ............. H01L 29/4238; H01L 29/0696; H01L 29/7811; H01L 29/1608; H10D 62/8325; H10D 30/665; H10D 62/127
See application file for complete search history.

(56) References Cited

U.S. PATENT DOCUMENTS

| | | | |
|---|---|---|---|
| 2007/0264824 A1* | 11/2007 | Siew | ................ H01L 21/02074 257/E21.59 |
| 2011/0278650 A1 | 11/2011 | Tamaki et al. | |
| 2014/0197422 A1 | 7/2014 | Wada et al. | |
| 2014/0197476 A1 | 7/2014 | Shimatou | |
| 2016/0276448 A1 | 9/2016 | Ohara et al. | |
| 2017/0263712 A1* | 9/2017 | Siemieniec | ......... H01L 29/7805 |
| 2018/0204917 A1 | 7/2018 | Lin et al. | |

(Continued)

*Primary Examiner* — Samuel A Gebremariam
*Assistant Examiner* — Jonas T Beardsley
(74) *Attorney, Agent, or Firm* — Cooper Legal Group LLC (57) ABSTRACT

In an example, a silicon carbide device includes a silicon carbide body. The silicon carbide body includes a central region and a peripheral region surrounding the central region. The central region includes a source region of a first conductivity type. The peripheral region includes a doped region of a second conductivity type. A stripe-shaped gate electrode extends through the central region and into the peripheral region. A contiguous source metallization is formed on the central region and on an inner portion of the peripheral region. The contiguous source metallization and the source region form a first ohmic contact in the central region. The contiguous source metallization and the doped region form a second ohmic contact in the peripheral region.

20 Claims, 10 Drawing Sheets

(56) References Cited

U.S. PATENT DOCUMENTS

| | | |
|---|---|---|
| 2019/0097004 A1* | 3/2019 | Ina .................... H01L 29/1608 |
| 2019/0165159 A1 | 5/2019 | Wehrhahn-Kilian et al. |
| 2019/0245075 A1 | 8/2019 | Aichinger et al. |
| 2019/0288073 A1 | 9/2019 | Okumura et al. |
| 2020/0185517 A1* | 6/2020 | Nakao ................. H10D 84/146 |

* cited by examiner

SILICON CARBIDE DEVICE WITH STRIPE-SHAPED GATE ELECTRODE AND SOURCE METALLIZATION

RELATED APPLICATION

This application claims priority to European Patent Application No. 20197223.9, filed on Sep. 21, 2020, entitled "SILICON CARBIDE DEVICE WITH STRIPE-SHAPED GATE ELECTRODE AND SOURCE METALLIZATION", which is incorporated by reference herein in its entirety.

TECHNICAL FIELD

Examples of the present disclosure relate to a silicon carbide device with stripe-shaped gate electrodes, for example to a silicon carbide device with insulated gate transistor cells and a source metallization.

BACKGROUND

Power semiconductor devices are typically used as switches and rectifiers in electric circuits for transforming electrical energy, for example, in DC/AC converters, AC/AC converters or AC/DC converters, and in electric circuits that drive heavy inductive loads, e.g. in motor driver circuits. Since the dielectric breakdown field strength of silicon carbide (SiC) is high compared to silicon (Si), SiC power devices may be significantly thinner and may show lower on-state resistance than their silicon counterparts. Since the quality of the SiC wafer is critical to achieving high-quality SiC power devices, the SiC wafer constitutes a major portion of the total chip cost. Consequently, there is a constant need to improve area efficiency of silicon carbide devices at little effort.

SUMMARY

An embodiment of the present disclosure relates to a silicon carbide device. The silicon carbide device includes a silicon carbide body including a central region and a peripheral region surrounding the central region. The central region includes a source region of a first conductivity type. The peripheral region includes a doped region of a second conductivity type. A stripe-shaped gate electrode extends through the central region and into the peripheral region. A contiguous source metallization is located on the central region and on an inner portion of the peripheral region. The contiguous source metallization and the source region form a first ohmic contact in the central region. The contiguous source metallization and the doped region form a second ohmic contact in the peripheral region.

An embodiment of the present disclosure relates to a silicon carbide device. The silicon carbide device includes a silicon carbide body including a central region and a peripheral region surrounding the central region. The central region includes a source region of a first conductivity type. The peripheral region includes a doped region of a second conductivity type. A stripe-shaped gate electrode extends through the central region and into the peripheral region. A contiguous source metallization is located on the central region and on an inner portion of the peripheral region. The contiguous source metallization and the source region form a first ohmic contact in the central region. The contiguous source metallization and the doped region form a second ohmic contact in the peripheral region. The silicon carbide device includes a plurality of first ohmic contacts. The silicon carbide device includes a gate conductor in contact with the stripe-shaped gate electrode. The gate conductor is formed on a first main surface of the silicon carbide body and crosses a longitudinal center of the stripe-shaped gate electrode.

An embodiment of the present disclosure relates to a silicon carbide device. The silicon carbide device includes a silicon carbide body including a central region and a peripheral region surrounding the central region. The central region includes a source region of a first conductivity type. The peripheral region includes a doped region of a second conductivity type. A stripe-shaped gate electrode extends through the central region and into the peripheral region. A contiguous source metallization is located on the central region and on an inner portion of the peripheral region. The contiguous source metallization comprises a source contact structure extending parallel to the stripe-shaped gate electrode. The source region and the source contact structure of the contiguous source metallization form a first ohmic contact in the central region. The doped region and the source contact structure of the contiguous source metallization form a second ohmic contact in the peripheral region. The source contact structure forms the first ohmic contact and the second ohmic contact. The silicon carbide device includes a gate pad electrically connected to the stripe-shaped gate electrode. Portions of the contiguous source metallization are on four lateral sides of the gate pad.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and together with the description serve to explain principles of the embodiments. Further embodiments are described in the following detailed description and the claims.

DETAILED DESCRIPTION

In the following detailed description, reference is made to the accompanying drawings, which form a part hereof and in which are shown by way of illustrations specific embodiments in which a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "on" is not to be construed as meaning "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The terms "power semiconductor device" and "SiC power device" refer to semiconductor devices with a high voltage blocking capability of at least 30 volts (V), for example 100 V, 600 V, 1.6 kilovolts (kV), 3.3 kV or more and with a nominal on-state current or forward current of at least 1 ampere (A), for example 10 A or more.

An ohmic contact describes a non-rectifying electrical junction between two conductors, such as between a semiconductor material and a metal. The ohmic contact may have a linear or approximately linear current-voltage (I-V) curve in the first and third quadrant of the I-V diagram as with Ohm's law.

A silicon carbide device may include a silicon carbide body that includes a central region and a peripheral region, wherein the peripheral region may surround the central region.

The silicon carbide device may be a power semiconductor device with a plurality of transistor cells TC electrically connected in parallel. Transistor cells of the plurality of transistor cells may be identical to each other. In some examples, the silicon carbide device may be and/or may include an IGFET (insulated gate field effect transistor) such as an MOSFET (metal oxide semiconductor field effect transistor), an IGBT (insulated gate bipolar transistor), or an MCD (metal oxide semiconductor controlled diode).

The silicon carbide body may have two essentially parallel main surfaces, which may have approximately the same shape and size, and a lateral surface connecting the edges of the two main surfaces. For example, the silicon carbide body may be a cylinder or a polygonal, e.g. rectangular or hexagonal, prism with or without rounded edges. The silicon carbide body may have a surface extension along two horizontal directions and may have a thickness along a vertical direction perpendicular to the horizontal directions. The horizontal directions are also referred to as lateral directions in the following.

The central region may include a source region of a first conductivity type. In some examples, the central region may include a plurality of functional transistor cells and each functional transistor cell includes a source region and a body region that separates the source region from a drain/drift structure (e.g., a structure including a drain structure and/or a drift structure). In an on-state of the silicon carbide device, a charge carrier channel connecting source region and drain/drift structure forms in the body region such that the functional transistor cells carry the load current through the silicon carbide device.

The peripheral region may laterally surround the central region on all sides and may be completely devoid of functional transistor cells. In some examples, the peripheral region may include portions of non-functional transistor cells and such portions of outermost functional transistor cells through which no load current flows in vertical direction through the first surface of the silicon carbide body. For example, in case the transistor cells are asymmetric with a controllable charge carrier channel formed only along an active sidewall of the gate electrode, the peripheral region may include the gate electrode of an outermost functional, asymmetric transistor cell and the shielding region on the inactive sidewall of the gate electrode of the outermost functional transistor cell. In addition or alternatively, the peripheral region may include one or more dummy gate electrodes. In some examples, the one or more dummy gate electrodes are not controllable and/or are not part of functional transistor cells.

The peripheral region may include a termination structure for laterally accommodating an electric field. The termination structure may include JTE (junction termination extension), field rings and/or LVD (lateral variation of doping). In some examples, in the peripheral region, no charge carriers enter into or exit from the silicon carbide body through a first main surface at a front side of the silicon carbide body in a static on-state of the silicon carbide device, i.e. after discharge of mobile charge carriers from the peripheral region.

The peripheral region may include a doped region of a complementary second conductivity type (e.g., the second conductivity type may be complementary to the first conductivity type). P-type may be complementary to n-type. In an example, the first conductivity type may be p-type and the second conductivity type may be n-type, or the first conductivity type may be n-type and the second conductivity type may be p-type. The doped region may form at least a part of the termination structure. For example, the doped region may form or may be part of a JTE or LVD.

The silicon carbide device may further include a stripe-shaped gate electrode that extends through a portion of the central region or through the complete central region, wherein a longitudinal axis of the gate electrode may run parallel to a horizontal x-axis, and wherein the gate electrode may laterally extend into the peripheral region. The gate electrode may include and/or consist of doped polycrystalline silicon and may include a cap layer from a metal silicide.

The silicon carbide device may further include a contiguous source metallization on at least a portion of the central region and on an inner portion of the peripheral region. In some examples, the contiguous source metallization may span in one piece from an outer portion of the central region to and over an inner portion of the peripheral region along one, two, three or four lateral edges of the central region, wherein between the outer portion of the central region and the inner portion of the peripheral region, the source metallization may be devoid of lateral constrictions.

The source metallization may include a main layer including elemental copper (Cu), elemental aluminum (Al) and a copper aluminum alloy (AlCu), molybdenum (M) and/or a layer stack including at least titanium (Ti) and tungsten (W), e.g. a Ti/TiN/W layer stack. Along the interface to the silicon carbide body, the source metallization may include a contact layer from a contact material. The contact material may be and/or may include nickel aluminum (NiAl), by way of example.

The contiguous source metallization may have openings in a distance to an interface between the peripheral region and the central region. In the openings of the source metallization, a gate pad and/or a metal gate conductor may be formed.

The source metallization and the source region may form a low-resistive first ohmic contact (e.g., an ohmic contact having a resistivity lower than a threshold resistivity) in the central region. Each first ohmic contact may include one single contact area or may include two or more contact areas, which are separated from each other along the x-axis.

The source metallization and the doped region may form a low-resistive second ohmic contact (e.g., an ohmic contact having a resistivity lower than a threshold resistivity) in the peripheral region. The second ohmic contact may include one single contact area or may include two or more laterally separated contact areas.

According to some embodiments, such as in an embodiment in which the silicon carbide device is a power semiconductor device, the silicon carbide device may include a gate runner (e.g., a metal gate runner) and/or gate fingers (e.g., metal gate fingers). For example, power semiconductor devices based on silicon carbide typically include a metal gate runner and metal gate fingers. The gate runner (e.g., the metal gate runner) may form an open frame around the central region. The gate fingers (e.g., the metal gate fingers) may extend from the gate runner into the central region and cross the gate electrodes. The gate runner and the gate fingers provide a low-ohmic electric connection (e.g., an electric connection having a resistance lower than a threshold resistance) between the gate electrodes of the transistor cells and the gate pad. The lower the resistance of the electric connection between the gate electrodes and the gate pad is, the lower is the gate resistance, the higher is the potential switching rate and the more synchronous is the switching behavior across the total lateral extension of the silicon carbide body.

In some examples, since the electrical connection between the doped region and the outermost contacts in the central region typically is not sufficiently low-resistive for a proper discharge of the mobile charge carriers from the peripheral region, a metal source runner typically forms an outer frame around the gate runner frame. The metal source runner provides a low ohmic connection (e.g., a connection having a resistance lower than a threshold resistance) between the source pad and the doped region in the peripheral region. The better (e.g., less resistive) the electric connection between the comparatively high-resistive doped region in the peripheral region and the source pad is, the more effective is a discharge of mobile charge carriers from the peripheral region, when the silicon carbide device turns off.

The metal gate runner laterally separates the metal source runner, which is formed between the metal gate runner and the lateral surface of the silicon carbide body, and the source pad, which is formed in the central region of the silicon carbide device. In some examples, due to technological restrictions concerning the patterning of metal layers, gaps between the metal gate runner and the source pad and between the metal gate runner and the source runner have a width of ten micrometers and more. In some examples, the space between the metal gate runner and the source pad and the space between the metal gate runner and the source runner is at least partially lost for both the termination structure and the transistor cells.

The contiguous source metallization provides a low-resistive connection (e.g., a connection having a resistivity lower than a threshold resistivity) to the doped region in the peripheral region but at the same time avoids wide gaps (e.g., gaps having a width exceeding a threshold) and therefore saves space. The metal gate runner may be completely omitted or may be replaced with non-metal structures. For example, the metal gate runner may be completely omitted or may be replaced with non-metal structures for silicon carbide devices with gate electrodes having a comparatively short longitudinal extension, e.g. for silicon carbide devices with a nominal blocking voltage of at most 1.2 kV, e.g. at most 650V.

In combination with the second ohmic contacts, the contiguous source metallization may improve the discharge of mobile charge carriers from the peripheral region and may reduce the risk of Avalanche breakdowns in the peripheral region at high area efficiency (e.g., area efficiency higher than a threshold area efficiency), wherein unintended Avalanche breakdowns may increase switching losses and the risk of a device fault.

According to an embodiment, the silicon carbide device may include a plurality of first ohmic contacts. A lateral boundary of the central region may be and/or may approximate a rectangle with parallel first lateral edges and with parallel second lateral edges orthogonal to the first lateral edges. The first and second lateral edges may be defined by the outer lateral edges of the first ohmic contacts.

For example, two opposite ends of each first ohmic contact along the x-axis define points of the two first lateral edges of the central region. Each first lateral edge connects (e.g., directly connects) the outermost edges of the first ohmic contacts at one side of the central region.

For example, if the ends of all first ohmic contacts at the same side of the central region lie on a straight line, such straight line defines one of the first lateral edges of the central region that extend along a lateral y-axis and orthogonal to the x-axis and the gate electrodes. Otherwise, if the ends of first ohmic contacts at the same side of the central region do not lie on a straight line, the first lateral edges may include slightly tilted sections.

Outermost edges of the two outermost first ohmic contacts along the y-axis may define the second lateral edges of the central region.

According to an embodiment, the silicon carbide device may include a gate conductor. The gate conductor may be in contact (e.g., direct contact) with the gate electrode. The gate conductor may be formed on a first main surface at a front side of the silicon carbide body and may cross a longitudinal center of the gate electrode.

The gate conductor may be a metallic structure including elemental metal, metal alloy and/or metal compound. The gate conductor may cross a plurality of stripe-shaped gate electrodes arranged parallel to each other, wherein the gate conductor may be in contact (e.g., direct contact) with each of the gate electrodes.

The source metallization may include two parts on opposite sides of the gate conductor. Each source metallization part may have a sufficiently large cross-sectional area to be used as support basis for a bond wire. The gate conductor may provide a low-ohmic connection (e.g., a connection having a resistance lower than a threshold resistance) between the gate pad and the gate electrodes at only low loss of active area (e.g., loss of active area that is less than a threshold).

According to an embodiment, the silicon carbide device may include a gate connection plate. The gate connection plate may include doped polycrystalline silicon and may be in contact (e.g., direct contact) with the gate electrode. The gate connection plate may cross the gate electrode between a longitudinal center of the gate electrode and a first end of the gate electrode. The first ohmic contact may be formed on a first side of the gate connection plate. The second ohmic contact may be formed on an opposite second side of the gate connection plate.

The gate connection plate may cross a plurality of stripe-shaped gate electrodes arranged parallel to each other, wherein the gate connection plate may be in contact (e.g., direct contact) with each of the gate electrodes.

Since the gate connection plate consists of and/or includes at least partly or mainly polycrystalline silicon, the gate connection plate may be formed prior to and independently from the process forming the source metallization. In some examples, the source metallization may span across the gate connection plate. A gap between the gate connection plate and the first ohmic contact can be narrower than a gap between a metal gate runner and the first ohmic contact. A gap between the gate connection plate and the second ohmic contact can be narrower than a gap between a metal gate runner and the second ohmic contact. The available patterning processes for polycrystalline silicon allow the formation of a comparatively narrow gate connection plate in a simple way.

The gate connection plate may be a one-part structure or may include several laterally separated portions. For example, the gate connection plate may include two or more stripe-shaped portions running parallel to each other to reduce the effective gate resistance and to improve the reliability of the connection to the gate electrodes.

According to an embodiment, the source region and the source metallization may form a portion of the first ohmic contact on the second side of the gate connection plate. The gate connection plate may be formed closer to a center of the longitudinal extension of the gate electrode than to an edge of the longitudinal extension of the gate electrode, wherein the gate connection plate may cross a plurality of stripe-shaped gate electrodes arranged parallel to each other, and wherein the gate connection plate may be in contact (e.g., direct contact) with each of the gate electrodes. The effective gate resistance may be more uniform across the complete central region.

According to an embodiment, the gate connection plate may include two separated portions on opposite sides of the longitudinal center of the gate electrode. For example, the two separated portions may be symmetric with respect to the longitudinal center of the gate electrode.

With a gate connection plate including two portions on opposite sides of the center of the longitudinal extension of the gate electrode, a metal gate conductor crossing across the longitudinal center of the gate electrode may become obsolete and more area may be used for functional transistor cells.

According to an embodiment, the gate connection plate may include a metal silicide cap. The metal silicide cap may reduce (e.g., significantly reduce) the gate resistance. The lower gate resistance (as provided by the metal silicide cap, for example) may facilitate higher potential switching rates and may contribute to more synchronous switching behavior across the total lateral extension of the silicon carbide body.

According to an embodiment, the source metallization may include a peripheral contact structure forming a frame around the central region. The peripheral contact structure and the doped region may form the second ohmic contact. The peripheral contact structure may include two or more laterally separated portions formed on a frame line around the central region. The peripheral contact structure may facilitate a low-ohmic connection (e.g., a connection having a resistance lower than a threshold resistance) between the source metallization and the doped region.

According to an embodiment, the source metallization may include a source contact structure extending parallel to the gate electrode. The source contact structure may be a contiguous structure or may include two or more laterally separated portions formed on a straight line parallel to the gate electrode. The source contact structure may form both the first ohmic contact and the second ohmic contact. The source contact structure may form a further ohmic contact to a doped region of the second conductivity type in the central region.

In some examples, the source contact structure may extend through at least an outer portion of the central region and into an inner portion of the peripheral region.

According to an embodiment, a gate pad may be electrically connected to the gate electrode e.g. through a metal gate conductor and/or through a gate connection plate. Gate electrodes and portions of the source metallization may be formed on all four lateral sides of the gate pad.

FIGS. 1A-7C illustrate silicon carbide devices 500 with a silicon carbide body 100.

The silicon carbide body 100 includes and/or consists of single crystalline silicon carbide, e.g., a silicon carbide crystal including the main constituents silicon and carbon. The silicon carbide crystal may include dopant atoms and further impurities like hydrogen, fluorine and/or oxygen. The polytype of the silicon carbide crystal may be 15R or may be hexagonal, e.g. 2H, 6H, or 4H. The silicon carbide body 100 may include and/or consist of a silicon carbide layer grown by epitaxy.

A first main surface 101 at a front side of the silicon carbide body 100 may be planar or ribbed. The mean plane of a planar first main surface 101 is identical with the planar first main surface 101. In case of a non-planar first main surface 101, for example in case of a ribbed first main surface 101, the mean plane may be a planar least squares plane. In some examples, position and orientation of the planar least squares plane are defined such that the sum of the squares of the deviations of surface points of the ribbed first main surface 101 from the planar least squares plane has a minimum.

The mean plane of the first main surface 101 extends along an x-axis and along a y-axis which is orthogonal to the x-axis. The x-axis and the y-axis define horizontal directions. A vertical direction along the z-axis is orthogonal to the horizontal directions, e.g. parallel to the surface normal onto the mean plane.

The vertical direction may coincide with a main lattice direction or may be tilted to a main lattice direction by an off-axis angle, wherein the off-axis angle may be in a range from 2° to 8°, such as about 4°. Opposite to the front side, a second main surface may extend parallel to the planar first main surface 101 or parallel to the least squares plane of a ribbed first main surface 101. A lateral surface 103 connects the edges of the first main surface 101 and the second main surface 102.

A peripheral region 690 laterally surrounds a central region 610 of the silicon carbide body 100. The peripheral region 690 is formed between the central region 610 and the lateral surface 103 of the silicon carbide body 100.

Insulated gate transistor cells TC electrically connected in parallel are formed at the front side of the silicon carbide body 100 in the central region 610. A drain/drift structure 130 (e.g., a structure including a drain structure and/or a drift structure) laterally extends through the silicon carbide body 100 between the insulated gate transistor cells TC and the second main surface. The drain/drift structure 130 may include a voltage sustaining structure, e.g., a lightly doped drift zone 131.

Each insulated gate transistor cell TC includes a source region 110 and a body region 121. The source region 110 and the body region 121 are doped portions of the silicon carbide body 100. The source region 110 has a first conductivity type. The body region 121 has a second conductivity type. For example, the source region 110 is n conducting and the body region 121 is p conducting.

The body region 121 separates the source region 110 of the transistor cell TC from the drain/drift structure 130. The body region 121 and the drain/drift structure 130 form a first pn junction. The body region 121 and the source region 130 of the same transistor cell TC form a second pn junction.

The source region 110 may be stripe-shaped with a horizontal longitudinal axis parallel to the x-axis. The source region 110 may extend through the central region 610 and may extend up to the boundary between the central region 610 and the peripheral region 690 or into the peripheral region 690.

The body region 121 may form part of a doped region 120 of the second conductivity type. The doped region 120 includes further portions, for example a doped termination region 128, a shielding region, and/or a contact region, by way of example.

Stripe-shaped gate structures 150 extend with a horizontal longitudinal axis parallel to the x-axis. Each gate structure 150 includes a conductive gate electrode 155 and a gate dielectric 159 separating the gate electrode 155 at least from the body region 121. The gate electrode 155 and the silicon carbide body 100 are electrically separated.

The gate structures 150 may include planar gate electrodes formed on the first main surface 101. The illustrated embodiments show trench gate structures 150 extending from the first main surface 101 into the silicon carbide body 100. The gate structures 150 laterally extend through the central region 610 and into the peripheral region 690.

A source metallization 310 including a source pad 315 and source contact structures 319 is formed on the first main surface 101. An interlayer dielectric 210 is formed between the first main surface 101 and the source pad 315. Source contact structures 319 extend from the source pad 315 through openings in the interlayer dielectric 210 to or into the source regions 110. The source contact structures 319 and the source regions 110 form first ohmic contacts in the central region 610.

The source contact structures 319 may be stripe-shaped with a horizontal longitudinal axis parallel to the x-axis. Alternatively, each source contact structure 319 may include a plurality of laterally separated parts formed along a straight line parallel to the x-axis. The source contact structures 319 may extend through the central region 610 and may extend up to the boundary between the central region 610 and the peripheral region 690 or into the peripheral region 690.

In the peripheral region 690, the doped termination region 128 of the second conductivity type extends from the first main surface 101 into the silicon carbide body 100. The doped termination region 128 is laterally connected to other doped regions of the same conductivity type in the central region 110. The doped termination region 128 laterally surrounds the central region 610.

The boundary between the peripheral region 690 and the central region 610 is defined by lateral ends of the source contact structures 319 along the x-axis or by lateral ends of the source regions 110 along the x-axis, whichever is farther from the lateral surface 103.

Figure 1A:
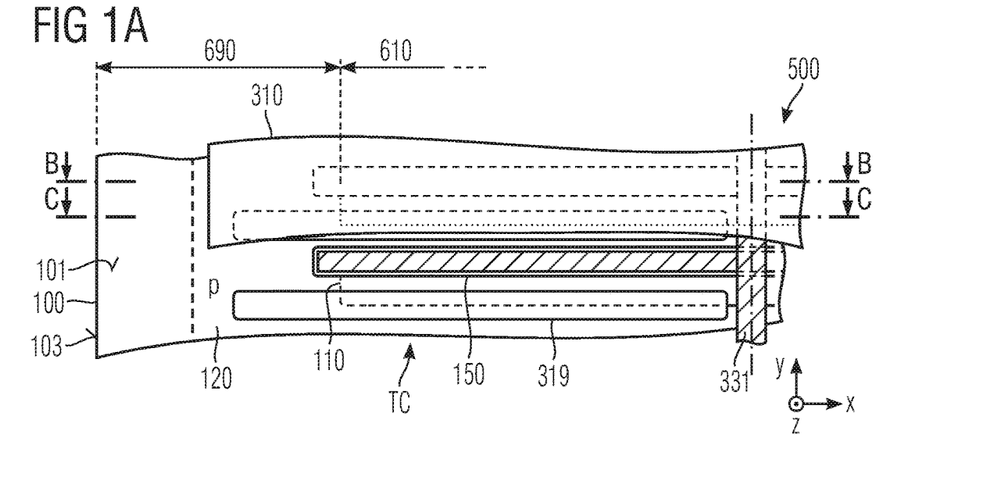
FIGS. 1A-1C show a schematic plan view and two parallel vertical cross-sectional views of a portion of a silicon carbide device with stripe-shaped gate electrode and a source metallization according to an embodiment with source contact structures laterally extending into a peripheral region.
Figure 1B:
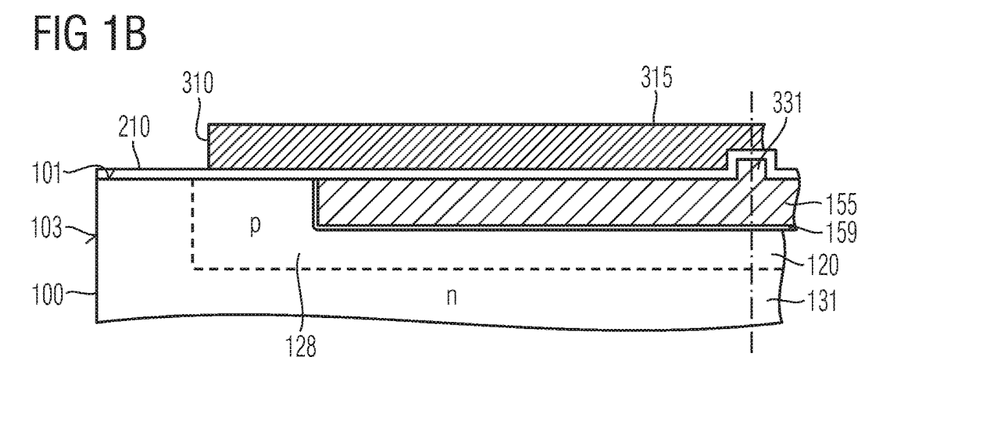
Figure 1C:
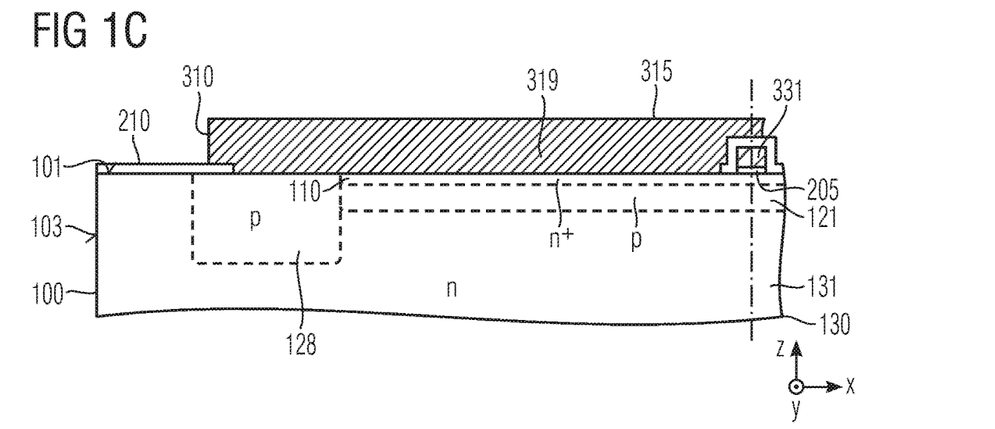

FIGS. 1A-1C refer to a silicon carbide device 500 with the source contact structures 319 protruding (e.g., protruding significantly) into the peripheral region 690. The boundary between the peripheral region 690 and the central region 610 is defined by the lateral ends of the source regions 110, which are shorter than the source contact structures 319 along the x-axis.

In some examples, the source contact structures 319 extend further into the peripheral region 690 than the gate structures 150. In the peripheral region 690, the source contact structures 319 and the doped termination region 128 form second ohmic contacts.

A gate connection plate 331 with a horizontal longitudinal axis along the y-axis crosses the gate structures 150 at or near at a longitudinal center of each gate structure 150. The gate connection plate 331 is in contact (e.g., direct contact) with each of the gate structures 150. A separation dielectric 205 separates the gate connection plate 331 and the silicon carbide body 100. The interlayer dielectric 210 covers the gate connection plate 331.

Figure 2A:
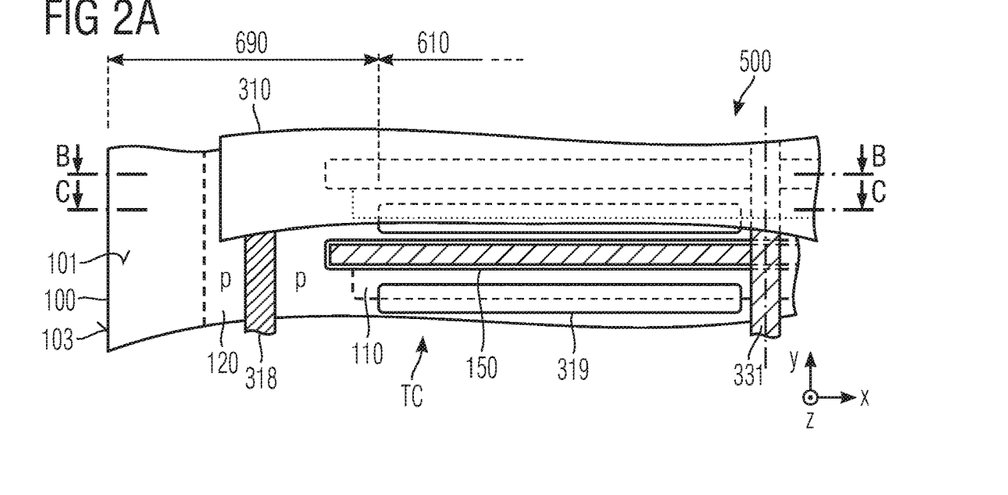
FIGS. 2A-2C show a schematic plan view and two parallel vertical cross-sectional views of a portion of a silicon carbide device according to an embodiment with the source metallization spanning across a central metal gate conductor and a gate connection plate.
Figure 2B:
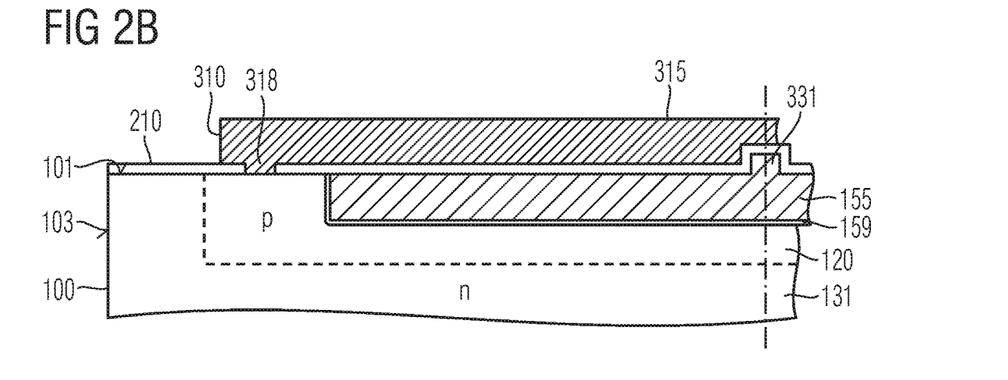
Figure 2C:
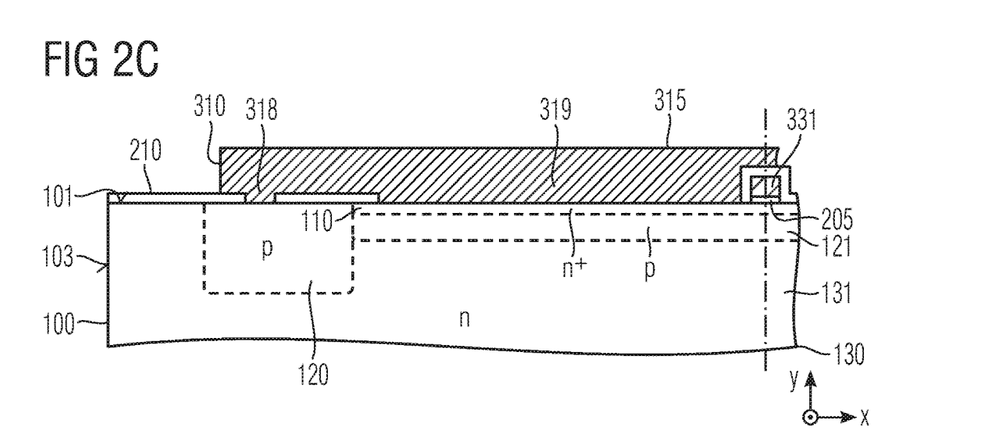

FIGS. 2A-2C refer to a silicon carbide device 500 with a peripheral contact structure 318 extending in the peripheral region 690 from the source pad 315 to or into the doped termination region 128. The peripheral contact structure 318 may include a plurality of laterally separated parts formed along a frame line around the central region 610. The boundary between the peripheral region 690 and the central region 610 is defined by the lateral narrow sides of the source contact structures 319.

Figure 3A:
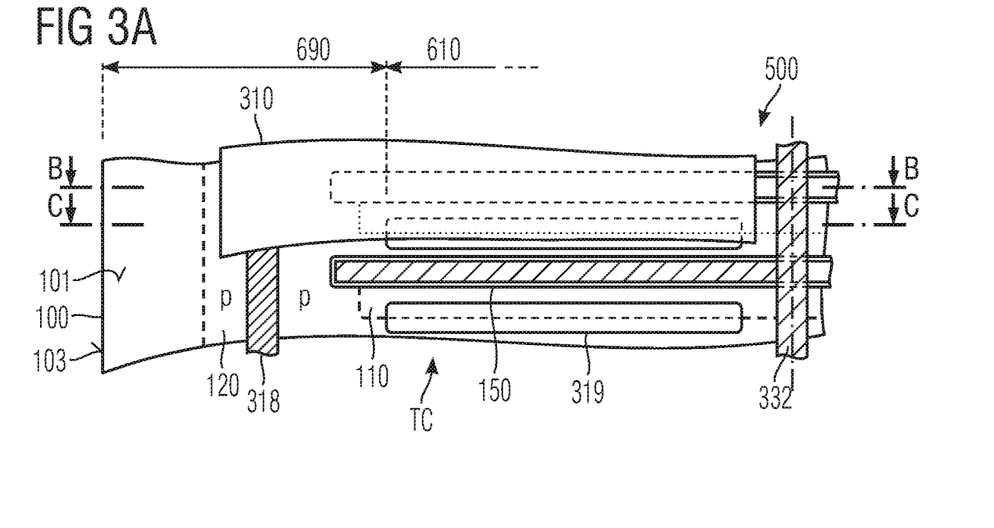
FIGS. 3A-3C show a schematic plan view and two parallel vertical cross-sectional views of a portion of a silicon carbide device according to an embodiment with source pad parts formed on opposite sides of a central metal gate conductor.
Figure 3B:
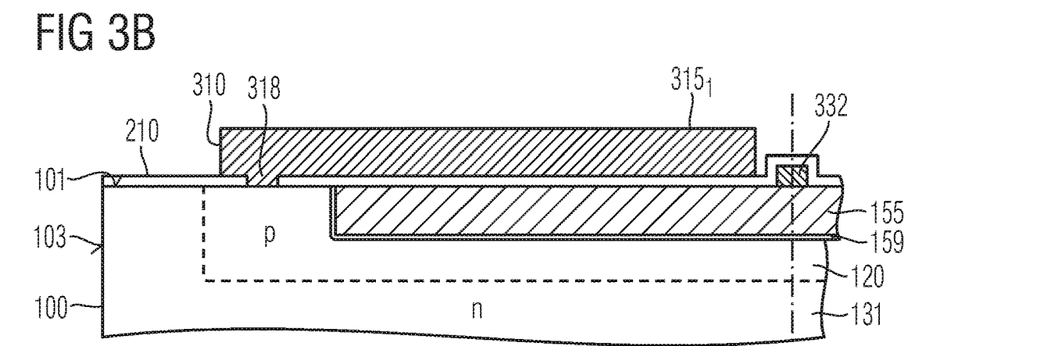
Figure 3C:
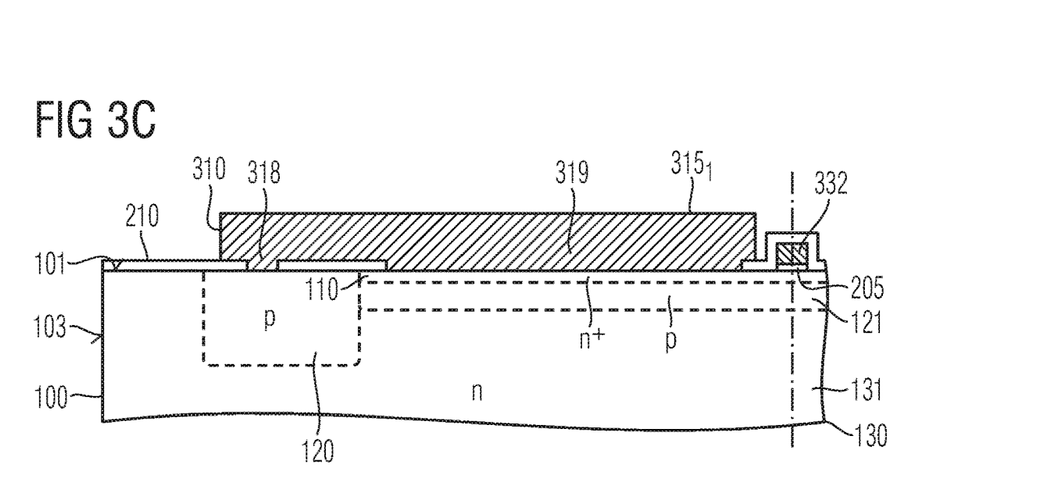

FIGS. 3A-3C show a metal gate conductor 332 instead of the gate connection plate 331 of FIG. 2A-2C. The source metallization 310 includes a first source pad part $315_1$ on a first side of the gate connection plate 331 and a second source pad part on the opposite second side (not illustrated).

Figure 4A:
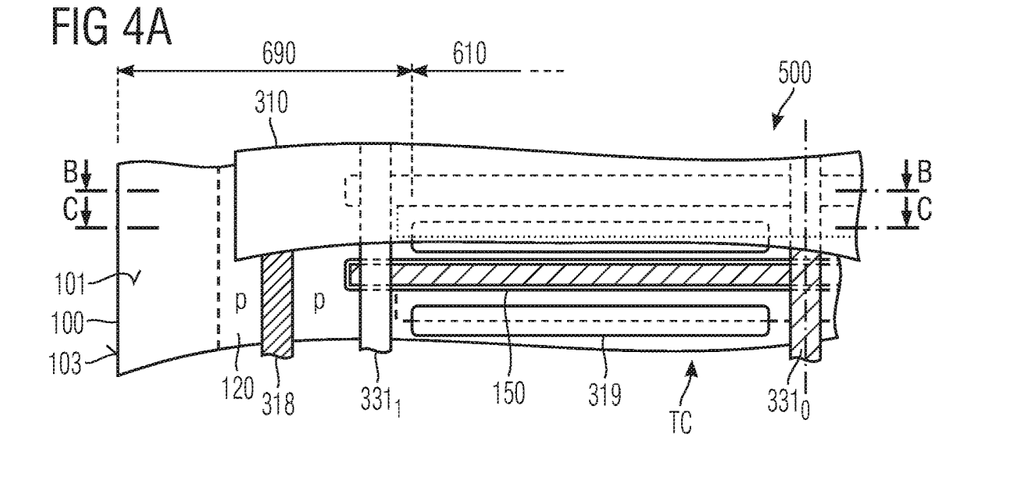
FIGS. 4A-4C show a schematic plan view and two parallel vertical cross-sectional views of a portion of a silicon carbide device according to an embodiment with a three-part gate connection plate.
Figure 4B:
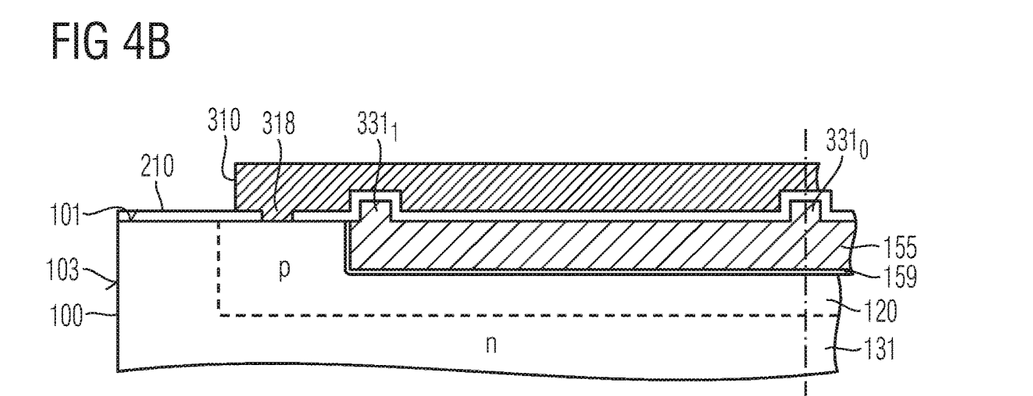
Figure 4C:
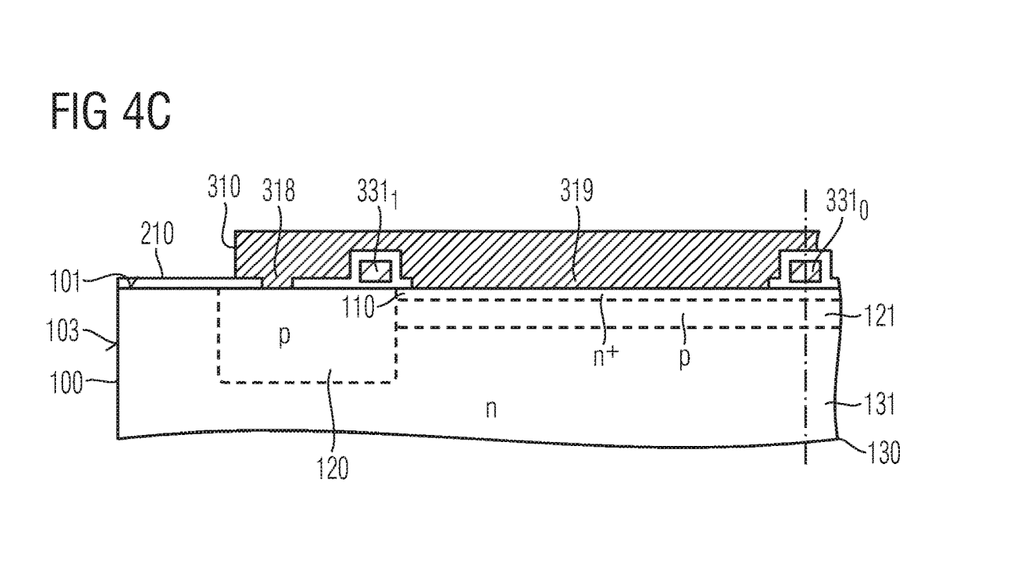

The silicon carbide device 500 illustrated in FIGS. 4A-4C include a gate connection plate 331 including a central gate connection plate portion $331_0$ and a first lateral gate connection plate portion $331_1$ close to (e.g., within a threshold distance of) a first end portion of the gate structures 150. A second lateral gate connection plate portion may be formed symmetrically with respect to the central gate connection plate portion $331_0$.

Figure 5A:
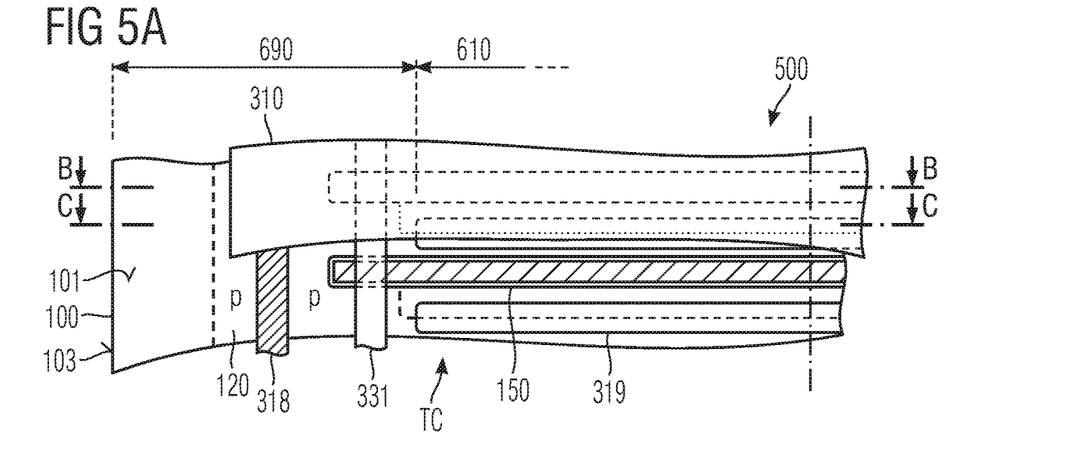
FIGS. 5A-5C show a schematic plan view and two parallel vertical cross-sectional views of a portion of a silicon carbide device according to an embodiment with a gate connection plate formed close to a gate electrode end portion.
Figure 5B:
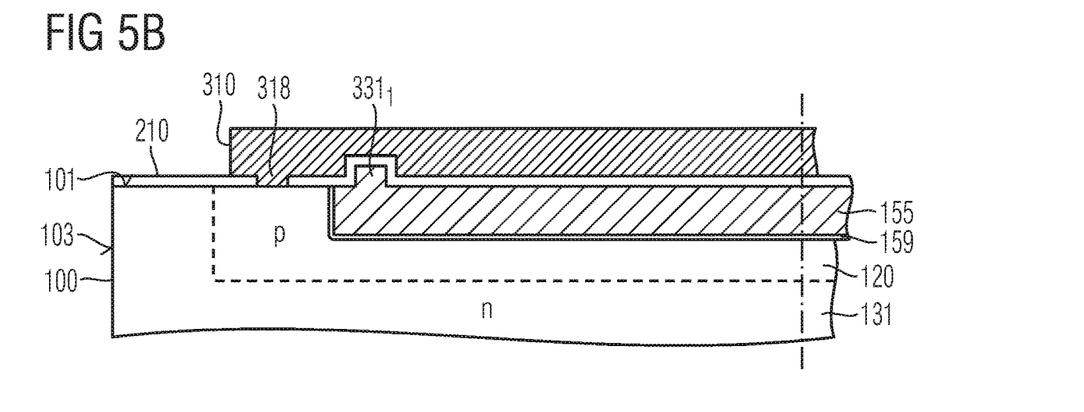
Figure 5C:
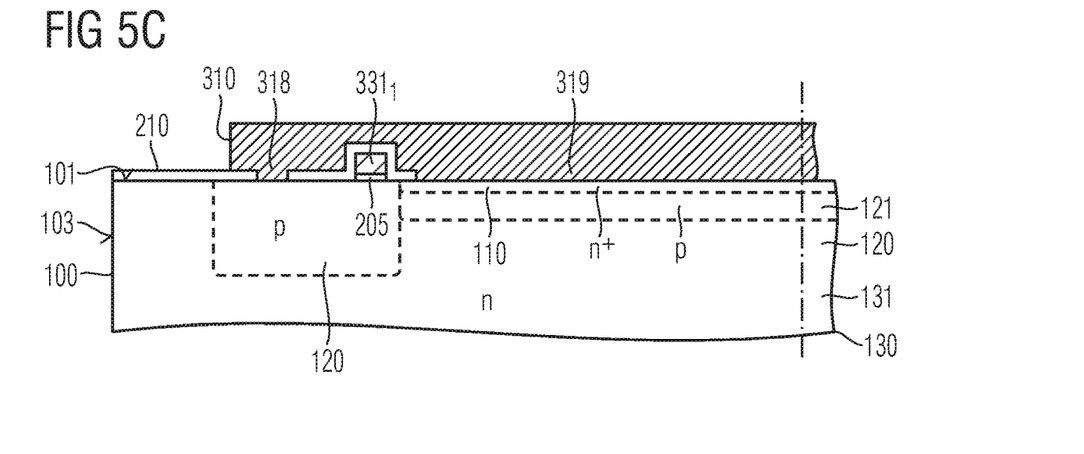

The silicon carbide device 500 illustrated in FIGS. 5A-5C includes the first lateral gate connection plate portions $331_1$ (e.g., only the first lateral gate connection plate portions $331_1$).

Figure 6A:
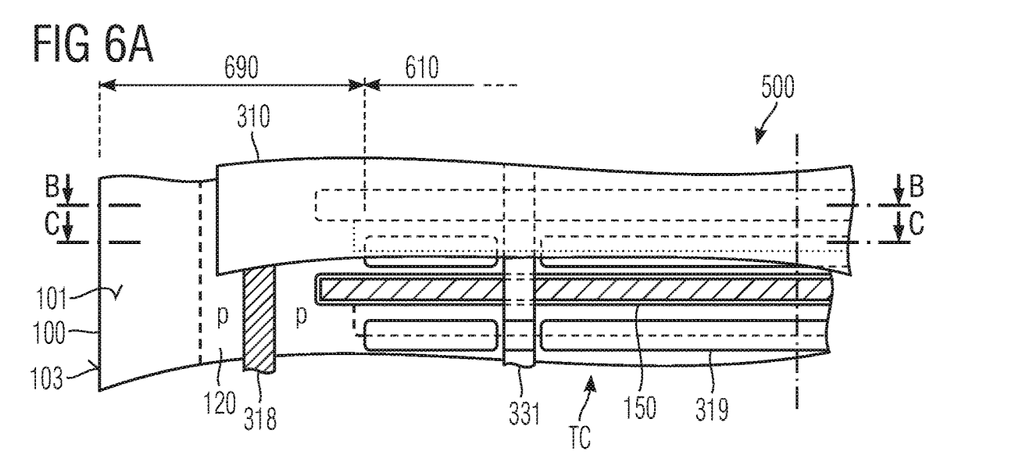
FIGS. 6A-6C show a schematic plan view and two parallel vertical cross-sectional views of a portion of a silicon carbide device according to an embodiment with a gate connection plate formed at a distance to a gate electrode end portion.
Figure 6B:
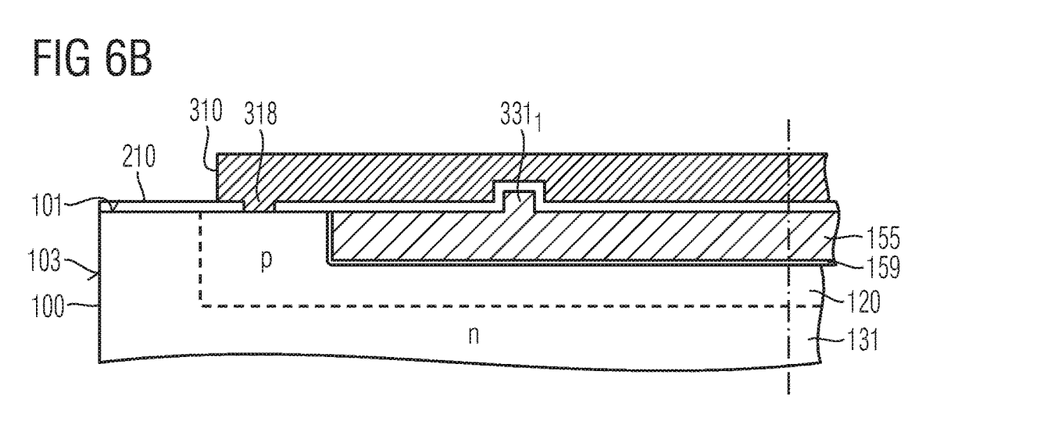
Figure 6C:
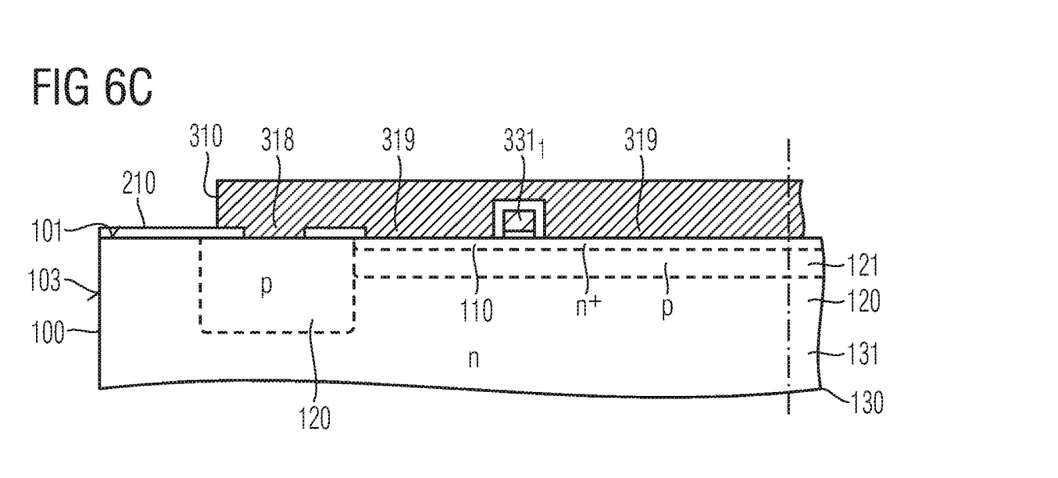

In FIGS. 6A-6C, the first lateral gate connection plate portions $331_1$ are shifted in direction of the center of the silicon carbide device 500 such that the source regions 110 and the source contact structures 319 form a portion of each first ohmic contact at the second side of the respective lateral gate connection plate portion $331_1$.

Figure 7A:
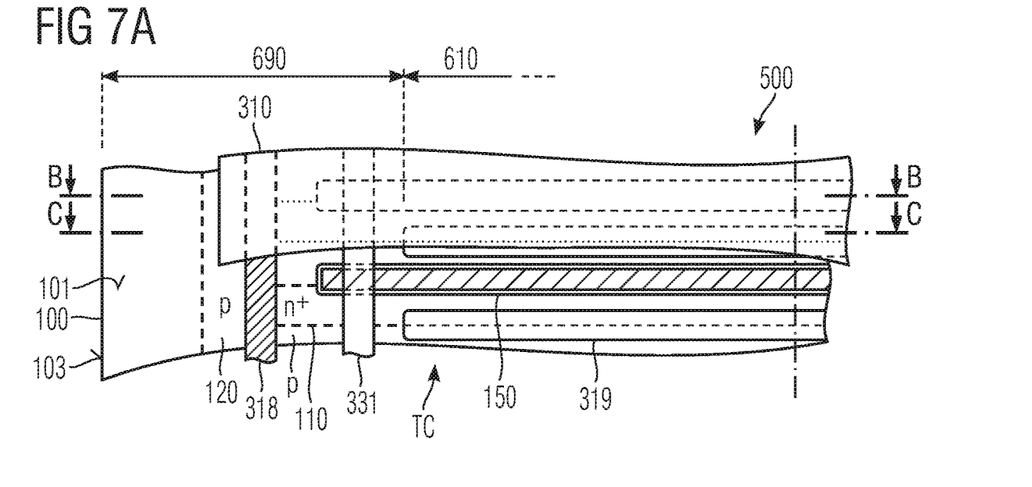
FIGS. 7A-7C show a schematic plan view and two parallel vertical cross-sectional views of a portion of a silicon carbide device according to an embodiment with silicided gate connection plate.
Figure 7B:
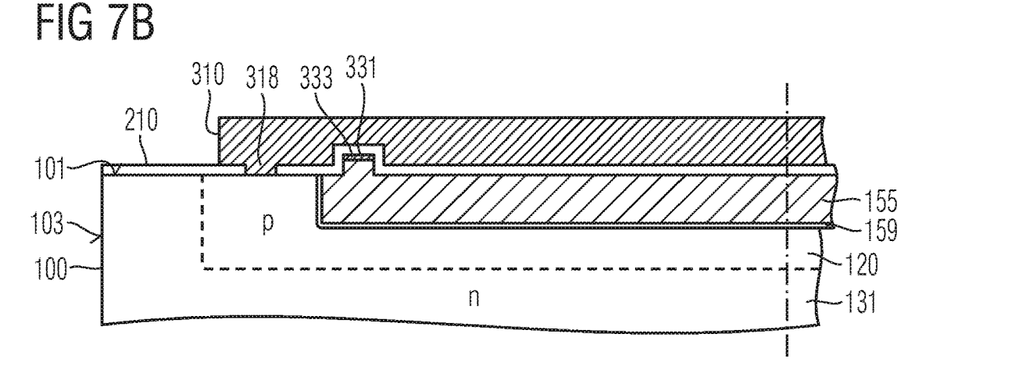
Figure 7C:
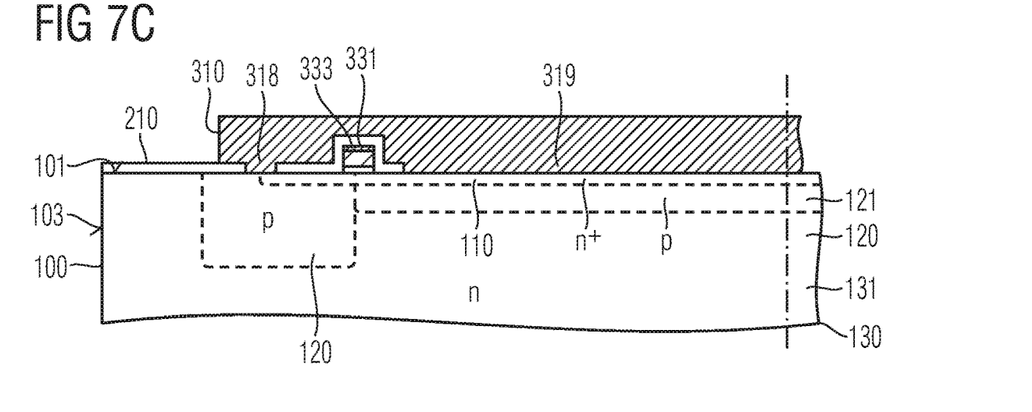

In FIGS. 7A-7C, the gate connection plate 331 includes a metal silicide cap 333. The metal silicide cap 333 may consist of and/or may include a titanium silicide, e.g. $TiSi_2$, a cobalt silicide, e.g. CoSi, or a molybdenum silicide, e.g. $MoSi_2$. The metal silicide cap 333 may reduce (e.g., significantly reduce) the sheet resistance of the gate connection plate 331. The source regions 110 laterally extend up to the peripheral contact structure 318, wherein the peripheral contact structure 318 and the source regions 110 form further low resistive ohmic contacts (e.g., ohmic contacts each having a resistivity lower than a threshold resistivity).

Figure 8A:
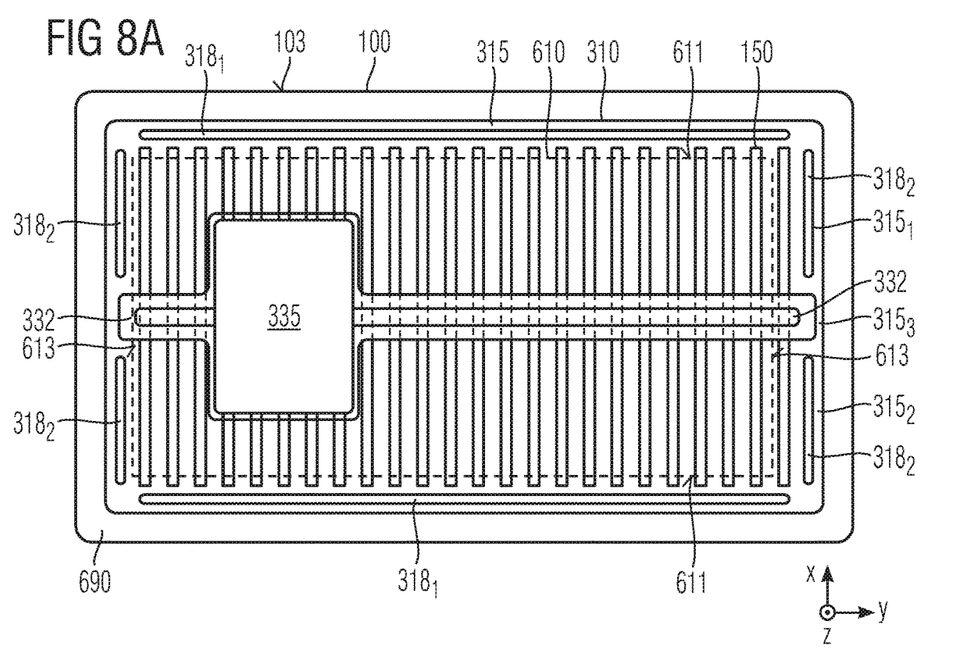
FIGS. 8A-8B show schematic plan views of silicon carbide devices according to further embodiments.

FIG. 8A shows a silicon carbide device 500 with a silicon carbide body 100, a metal gate conductor 332 as illustrated in FIGS. 3A-3C and a metal gate pad 335.

Horizontal longitudinal axes of the gate structures 150 extend parallel to the x-axis. Between the gate structures 150, stripe-shaped source regions (not illustrated) and source contact structures (not illustrated) extend parallel to the x-axis, wherein the source contact structures and the source regions form first ohmic contacts. The source contact structures may also form further ohmic contacts with doped regions with a conductivity type complementary to that of the source regions.

The metal gate conductor 332 includes two parts formed on opposite sides of the gate pad 335. The two parts are laterally connected to the gate pad 335 and extend parallel to the y-axis along a longitudinal center line of the silicon carbide device 500.

A line directly connecting outermost edges of neighboring first ohmic contacts at a first side 611 of the metal gate conductor 332 forms a first lateral edge of a central region 610 and a line directly connecting outermost edges of neighboring first ohmic contacts at an opposite second side of the metal gate conductor 332 forms another first lateral edge 611 of the central region 610. The first lateral edges 611 may be straight or approximately straight lines extending at least approximately along the y-axis. The outermost edges of the two outermost source contact structures form two second lateral edges 613 extending along the x-axis and connecting the first lateral edges 611. The central region 610 has or approximates a rectangular shape. A peripheral region 690 forms a closed frame around the central region 610. In the peripheral region 690, a doped region (not illustrated) with a conductivity type complementary to that of the source regions extends from the front side into the silicon carbide body 100. The doped region may surround the central region 610.

A source metallization 310 includes a source pad 315 with a first source pad part $315_1$ formed at a first side of the gate conductor 332 and with a second source pad part $315_2$ formed at an opposite second side of the gate conductor 332. Source pad connection parts $315_3$ formed between the narrow sides of the gate conductor 332 and the lateral surface 103 connect the first source pad part $315_1$ and the second source pad part $315_2$. The source pad 315 forms a closed frame around the gate pad 335 and the gate conductor 332 such that the source metallization 310 extends along all four lateral edges 611, 613 beyond the central region 610 and into the peripheral region 690.

In the peripheral region 690, a peripheral contact structure 318 extends from the source pad 315 to the silicon carbide body 100, wherein the peripheral contact structure 318 and the doped region form a second ohmic contact.

The peripheral contact structure 318 includes first peripheral contact structures 3181 extending parallel to the first lateral edges 611 of the central region 610 and second peripheral contact structures 3182 extending parallel to the second lateral edges 613.

Figure 8B:
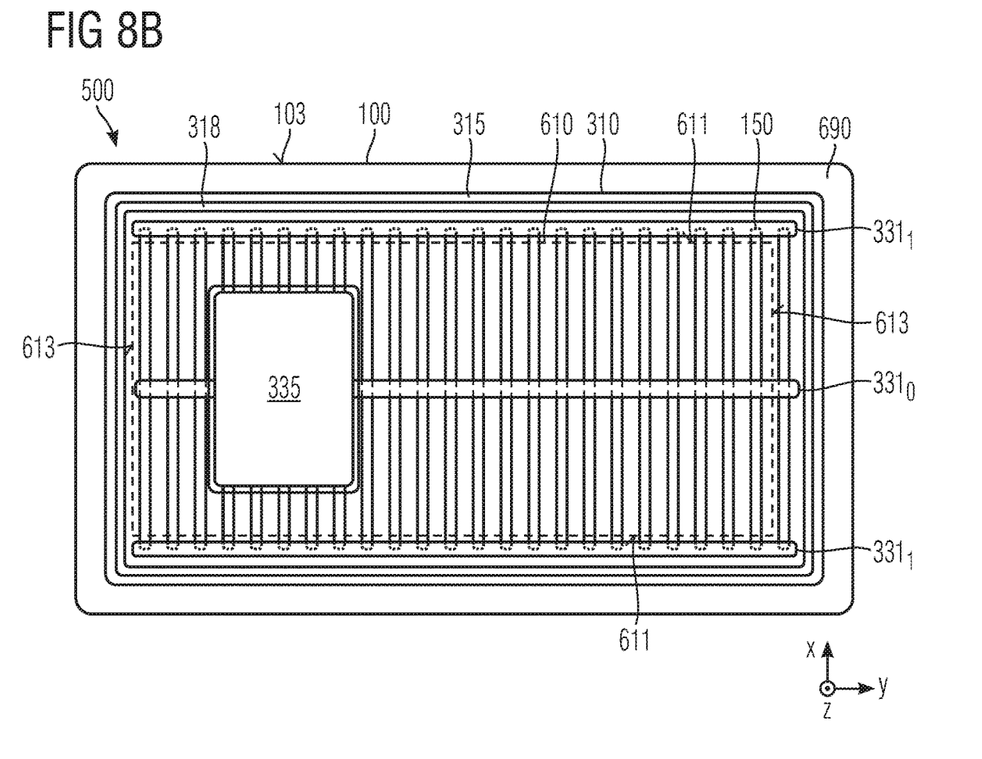
Figure 9A:
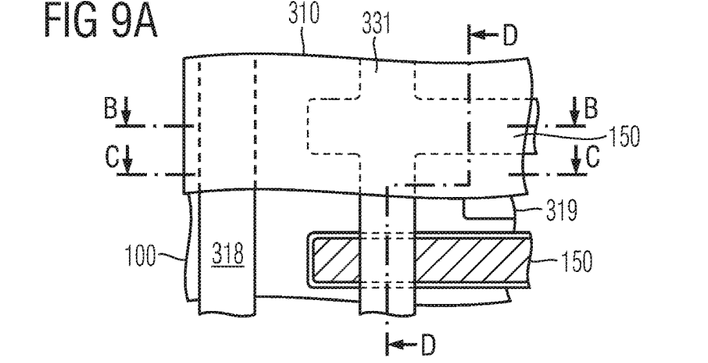
FIGS. 9A-9D show a schematic plan view and three vertical cross-sectional views of a portion of a silicon carbide device according to a further embodiment with a gate connection plate formed close to a gate electrode end portion.
Figure 9B:
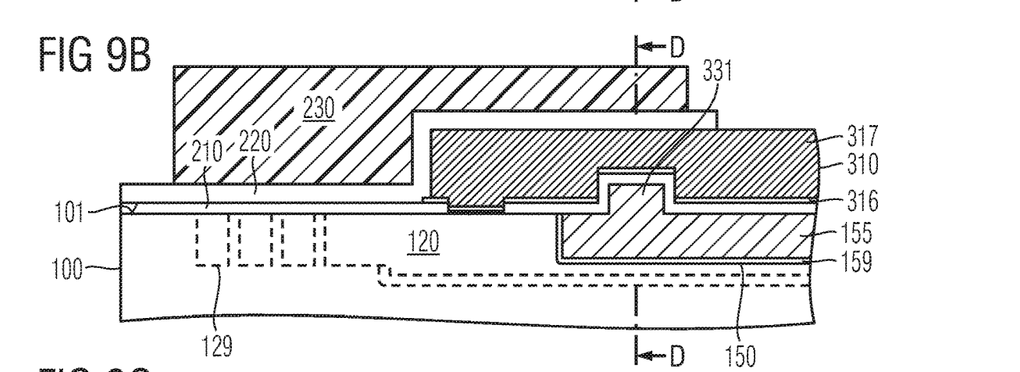
Figure 9C:
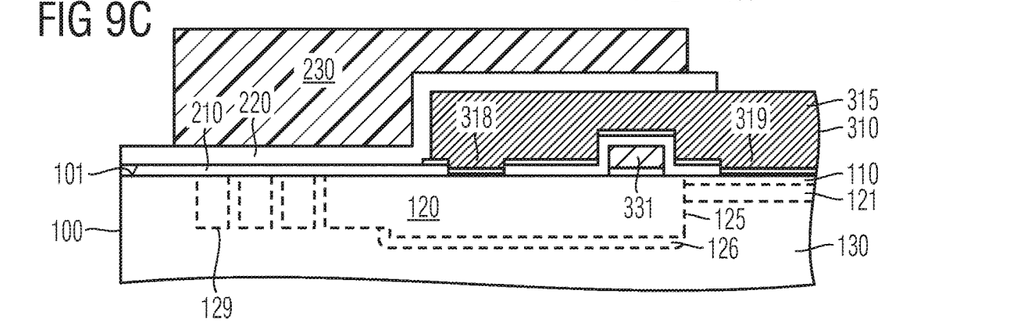
Figure 9D:
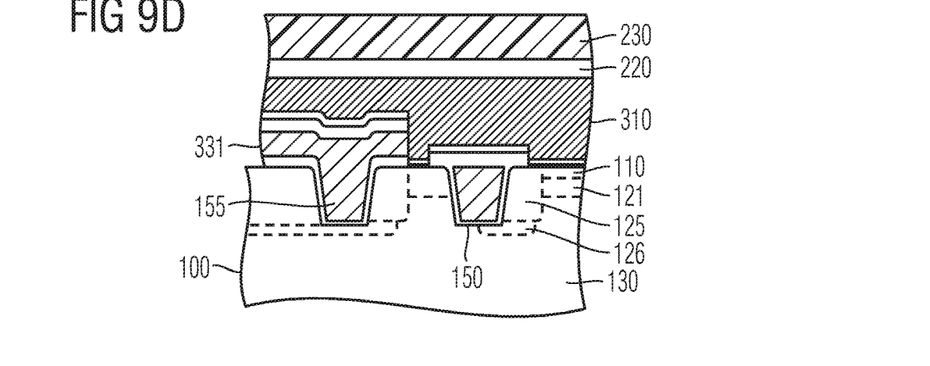
Figure 10A:
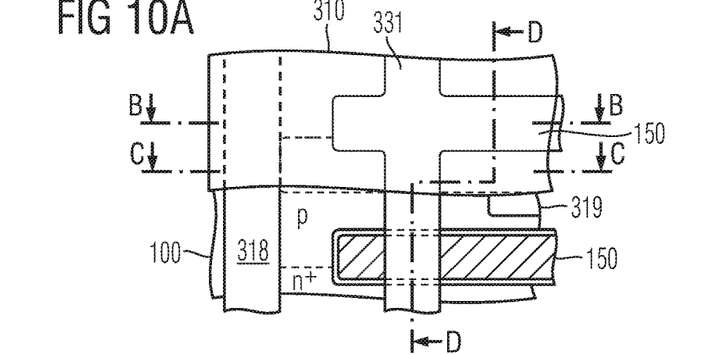
FIGS. 10A-10D show a schematic plan view and three vertical cross-sectional views of a portion of a silicon carbide device according to a further embodiment with a laterally extended source region.
Figure 10B:
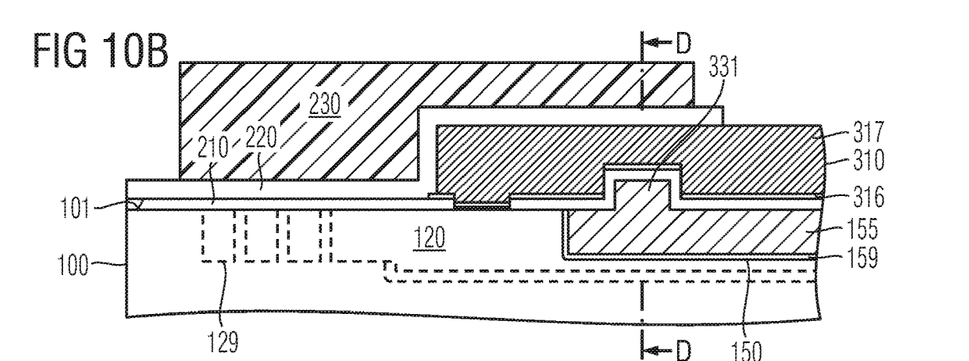
Figure 10C:
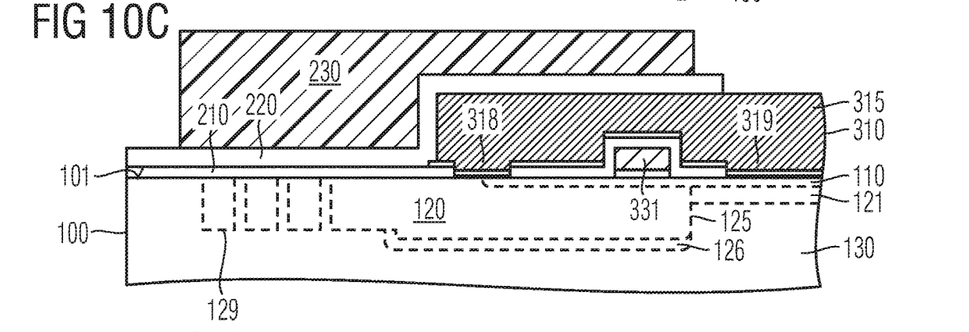
Figure 10D:
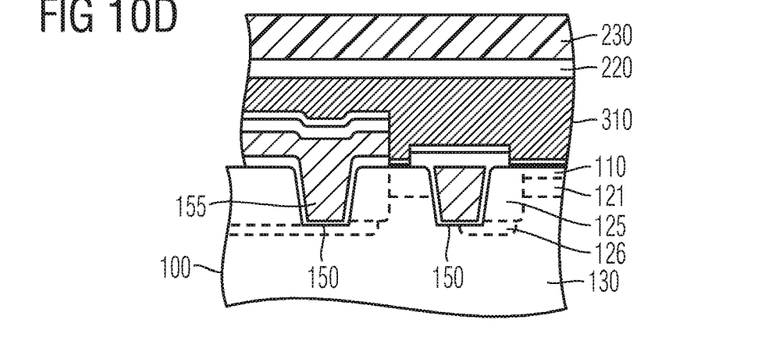

In FIG. 8B a three-part gate connection plate 331 with a central gate connection plate portion $331_0$ and two lateral gate connection plate portions $331_1$ replace the metal gate conductor 332 illustrated in FIG. 8A. The source pad 315 spans along the x-axis across all gate connection plate portions $331_0$, $331_1$. The peripheral contact structure 318 forms a closed contact frame.

FIGS. 9A-9D show details of the embodiments of FIGS. 2A-2C, 3A-3C, 4A-4C and 5A-5C.

Each transistor cell includes a p doped body region 121 separating the n doped source region 110 from a drain/drift structure 130. A p doped shielding region 126 extends along a portion of the bottom of each gate structure 150. A p doped connection region 125 extends from the first main surface 101 to the shielding region 126. The source contact structure 319 of each transistor cell forms a first ohmic contact with the source region and a further ohmic contact with the connection region 125.

The connection region 125 and the shielding region 126 extend laterally into the peripheral region. Portions of the connection region 125 and the shielding region 126 may form at least a portion of a doped termination region 128.

The doped termination region 128 and the peripheral contact structure 318 form the second ohmic contact. Between the doped termination region 128 and the lateral surface 103 of the silicon carbide body 100, laterally separated p doped guard rings 129 extend from the first main surface 101 into the silicon carbide body 100.

The doped termination region 128, the connection regions 125, the shielding regions 126 and the body regions 121 form portions of the doped region 120.

The source metallization 310 includes a source pad 315, the peripheral contact structure 319 and the source contact structures 318, wherein the peripheral contact structure 319 and the source contact structures 318 extend from the source pad 315 through openings in the interlayer dielectric 210 to the silicon carbide body 100.

The source metallization 310 includes a main layer 317 and a contact layer 316 between the main layer 317 and the silicon carbide body 100. The contact layer 316 may include NiAl or a layer stack including elemental Ti and TiN or elemental Ta and TaN.

A dielectric passivation layer 220 extends inwardly from the lateral surface 103 to beyond an outer edge of the source pad 315. An imide layer 230 may cover a portion of the passivation layer 220.

In FIGS. 10A-10D the source region 110 laterally extends up to the peripheral contact structure 319, wherein the high-conductive source region 110 (e.g., the source region 110 with conductivity higher than a threshold conductivity) improves the electrical connection in the peripheral region 690.

According to a further embodiment (not illustrated), the main layer 317 may end between the source contact structure 319 and the peripheral contact structure 318, e.g. in or close to (e.g., within a threshold distance of) the plane of the narrow sides of the gate structures 150, wherein area efficiency may be increased.

Though the description focuses on n-channel field effect transistor cells of the enhancement mode, the embodiments may also include other types of transistor cells, e.g. p-channel field effect transistor cells, or transistor cells of the depletion type.

Though the description focuses on transistor cells with trench gate structures and one-sided channel, the embodiments may also include transistor cells with planar gates and trench gate structures with two-sided channel.

What is claimed is:

1. A silicon carbide device, comprising:
   a silicon carbide body comprising a central region and a peripheral region surrounding the central region, wherein:
      the central region comprises a source region of a first conductivity type; and
      the peripheral region comprises a doped region of a second conductivity type;
   a gate structure extending through the central region and into the peripheral region; and
   a contiguous source metallization on the central region and on an inner portion of the peripheral region, wherein:
      the contiguous source metallization and the source region form a first ohmic contact in the central region;
      the contiguous source metallization and the doped region form a second ohmic contact in the peripheral region; and
      the source region in the central region is in direct contact, along a horizontal direction, with a doped termination region of the doped region of the peripheral region, and the contiguous source metallization is in direct contact, along a vertical direction, with both the source region and the doped termination region of the doped region of the peripheral region.

2. The silicon carbide device according to claim 1, wherein:
   the gate structure comprises a trench gate structure.

3. The silicon carbide device according to claim 1, comprising:
   a gate connection plate in contact with the gate structure.

4. The silicon carbide device according to claim 3, wherein:
   the first ohmic contact is on a first side of the gate connection plate; and
   the second ohmic contact is on a second side of the gate connection plate.

5. The silicon carbide device according to claim 1, comprising:
   a gate connection plate in contact with the gate structure, wherein:
      the gate connection plate comprises polycrystalline silicon;
      the gate connection plate crosses the gate structure between a longitudinal center of the gate structure and a first end of the gate structure;
      the first ohmic contact is on a first side of the gate connection plate; and
      the second ohmic contact is on a second side, of the gate connection plate, opposite the first side of the gate connection plate.

6. The silicon carbide device according to claim 1, wherein:
   the source region and the contiguous source metallization form a portion of the first ohmic contact on a side of a gate connection plate.

7. The silicon carbide device according to claim 1, wherein:
   a second gate structure of the silicon carbide device is at least one of separate from or parallel to the gate structure.

8. The silicon carbide device according to claim 1, wherein:
   a source contact structure of the contiguous source metallization that forms the first ohmic contact is stripe-shaped.

9. The silicon carbide device according to claim 1, wherein:
   the contiguous source metallization comprises a source contact structure extending parallel to the gate structure; and
   the source contact structure forms the first ohmic contact and the second ohmic contact.

10. The silicon carbide device according to claim 1, comprising:
    a gate pad electrically connected to the gate structure, wherein portions of the contiguous source metallization are on four lateral sides of the gate pad.

11. A silicon carbide device, comprising:
    a silicon carbide body comprising a central region and a peripheral region surrounding the central region, wherein:
       the central region comprises a source region of a first conductivity type; and
       the peripheral region comprises a doped region of a second conductivity type;

a gate structure extending through the central region and into the peripheral region;

a contiguous source metallization on the central region and on an inner portion of the peripheral region, wherein:

the contiguous source metallization and the source region form a first ohmic contact in the central region; and the contiguous source metallization and the doped region form a second ohmic contact in the peripheral region; and a gate conductor in contact with the gate structure, wherein the gate conductor is on a first main surface of the silicon carbide body and crosses a longitudinal center of the gate structure, wherein the source region in the central region is in direct contact, along a horizontal direction, with a doped termination region of the doped region of the peripheral region, and the contiguous source metallization is in direct contact, along a vertical direction, with both the source region and the doped termination region of the doped region of the peripheral region.

12. The silicon carbide device according to claim 11, wherein:

a first lateral edge of the central region is defined by a line connecting outer lateral edges, of one or more ohmic contacts, oriented to a same side of the central region.

13. The silicon carbide device according to claim 11, comprising:

a gate connection plate in contact with the gate structure, wherein:

the gate connection plate comprises polycrystalline silicon;

the gate connection plate crosses the gate structure between the longitudinal center of the gate structure and a first end of the gate structure;

the first ohmic contact is on a first side of the gate connection plate; and the second ohmic contact is on a second side, of the gate connection plate, opposite the first side of the gate connection plate.

14. The silicon carbide device according to claim 13, wherein:

the gate connection plate comprises two separated portions on opposite sides of the longitudinal center of the gate structure.

15. The silicon carbide device according to claim 13, wherein:

the gate connection plate comprises a metal silicide cap.

16. The silicon carbide device according to claim 13, wherein:

the contiguous source metallization comprises a peripheral contact structure forming a frame around the central region.

17. The silicon carbide device according to claim 11, wherein:

the source region and the contiguous source metallization form a portion of the first ohmic contact on a side of a gate connection plate.

18. The silicon carbide device according to claim 11, wherein:

the contiguous source metallization comprises a source contact structure extending parallel to the gate structure; and the source contact structure forms the first ohmic contact and the second ohmic contact.

19. The silicon carbide device according to claim 11, comprising:

a gate pad electrically connected to the gate structure, wherein portions of the contiguous source metallization are on four lateral sides of the gate pad.

20. A silicon carbide device, comprising:

a silicon carbide body comprising a central region and a peripheral region surrounding the central region, wherein:

the central region comprises a source region of a first conductivity type; and the peripheral region comprises a doped region of a second conductivity type;

a gate structure extending through the central region and into the peripheral region;

a contiguous source metallization on the central region and on an inner portion of the peripheral region, wherein:

the contiguous source metallization comprises a source contact structure extending parallel to the gate structure;

the source region and the source contact structure of the contiguous source metallization form a first ohmic contact in the central region;

the doped region and the source contact structure of the contiguous source metallization form a second ohmic contact in the peripheral region; and the source contact structure forms the first ohmic contact and the second ohmic contact; and a gate pad electrically connected to the gate structure, wherein portions of the contiguous source metallization are on four lateral sides of the gate pad, wherein the source region in the central region is in direct contact, along a horizontal direction, with a doped termination region of the doped region of the peripheral region, and the contiguous source metallization is in direct contact, along a vertical direction, with both the source region and the doped termination region of the doped region of the peripheral region.

* * * * *